(12) United States Patent
Lucidarme

(10) Patent No.: US 11,332,037 B2
(45) Date of Patent: May 17, 2022

(54) METHOD FOR EVALUATING AN ELECTRIC BATTERY STATE OF HEALTH

(71) Applicant: ELECTRICITE DE FRANCE, Paris (FR)

(72) Inventor: Thierry Lucidarme, Chevreuse (FR)

(73) Assignee: ELECTRICITE DE FRANCE, Paris (FR)

(*) Notice: Subject to any disclaimer, the term of this patent is extended or adjusted under 35 U.S.C. 154(b) by 385 days.

(21) Appl. No.: 16/458,809

(22) Filed: Jul. 1, 2019

(65) Prior Publication Data
US 2020/0009987 A1    Jan. 9, 2020

(30) Foreign Application Priority Data
Jul. 3, 2018  (EP) .................................... 18305867

(51) Int. Cl.
*B60L 58/16* (2019.01)
*B60L 3/00* (2019.01)
*G06K 9/62* (2022.01)

(52) U.S. Cl.
CPC ............. *B60L 58/16* (2019.02); *B60L 3/0046* (2013.01); *G06K 9/6278* (2013.01)

(58) Field of Classification Search
CPC ...... B60L 58/16; B60L 3/0046; G06K 9/8278
USPC .......................................................... 701/22
See application file for complete search history.

(56) References Cited

U.S. PATENT DOCUMENTS

| | | | |
|---|---|---|---|
| 2012/0150464 A1* | 6/2012 | Swanton | G01R 31/371 702/63 |
| 2015/0314700 A1* | 11/2015 | Ahn | H01M 10/486 320/128 |
| 2015/0369874 A1* | 12/2015 | Park | H02J 7/0047 702/63 |
| 2016/0003917 A1 | 1/2016 | You et al. | |
| 2016/0187428 A1 | 6/2016 | Basu et al. | |

FOREIGN PATENT DOCUMENTS

| CN | 103278777 B | 8/2015 |
|---|---|---|
| CN | 107219463 A | 9/2017 |

OTHER PUBLICATIONS

Office Action issued in related application CN 201910588724.5, dated Apr. 28, 2021, with machine generated English anguage translation, 14 pages.

He et al., "Prognostics of lithium-ion batteries based on Dempster-Shafer theory and the Bayesian Monte Carlo method," Journal of Power Sources, Elsevier SA, CH, Aug. 6, 2011, vol. 196 (23), pp. 10314-10321.

(Continued)

*Primary Examiner* — Gertrude Arthur Jeanglaude
(74) *Attorney, Agent, or Firm* — Faegre Drinker Biddle & Reath LLP

(57) ABSTRACT

A method for evaluating a state of health (SOH) of an electric battery of an electric vehicle, said method comprising a step of: performing a given number (m) of tests on the electric battery, each giving results, associating each result to a state of the battery, a given number (N) of states of the battery being possible, estimating a probability of each state of the battery on the basis of a Bayesian calculation, and estimating the SOH in function of the probability of each state and of the results of the tests, called estimated SOH.

6 Claims, 1 Drawing Sheet

(56) References Cited

OTHER PUBLICATIONS

Ng et al., "A naive Bayes model for robust remaining useful life prediction of lithium-ion battery," Applied Energy, vol. 118, Jan. 8, 2014, pp. 114-123.
Saha et al., "An Integrated Approach to Battery Health Monitoring Using Bayesian Regression and State Estimation," Proceedings of the IEEE Autotestcon 2007, Sep. 17, 2007, pp. 646-653.
European Search Report issued in related application EP 18305867.6, Feb. 18, 2019, 13 pages.

* cited by examiner

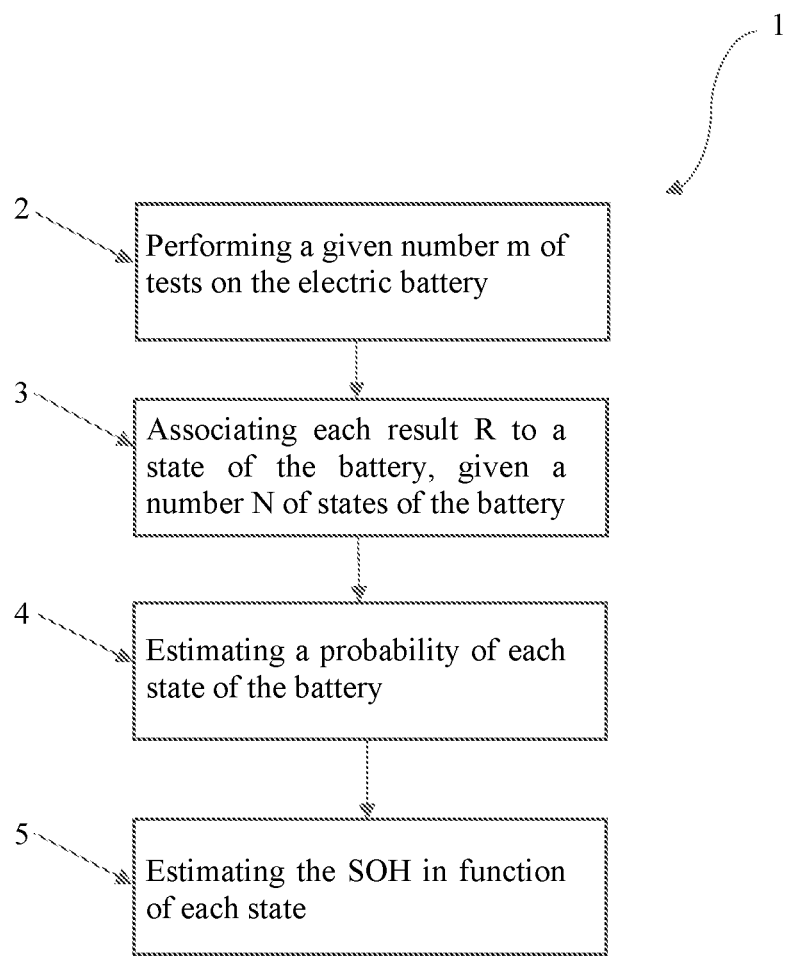

METHOD FOR EVALUATING AN ELECTRIC BATTERY STATE OF HEALTH

CROSS-REFERENCE TO RELATED APPLICATION

This application claims priority benefit under 35 U.S.C. § 119(d) from European Patent Application No. 18305867.6 filed Jul. 3, 2018, the disclosure of which is incorporated by reference herein in its entirety.

FIELD

The present disclosure relates to a method for evaluating a state of health (SOH) of an electric battery of an electric vehicle.

BACKGROUND

The degradation of the battery of an electric vehicle is caused over time by various conditions and usage parameters that the battery is operated under, such as high and low temperatures, applied voltages, currents and depth-of-discharge.

Many electric vehicle owners would like to be informed about how to optimally maintain vehicle range, battery life (and resale value of their battery).

Therefore, there is a large interest to keep track of the battery degradation and how it is related to electric vehicle operating conditions.

An important measure of the condition of the electric Vehicle battery is its State-Of-Health (SOH), which is an indicator for the capacity of the battery—or alternatively its degradation—i.e. a percentage indicating to what extent a battery's current capabilities match to its initial factory specifications.

The SOH is an important indicator as it directly relates to the maximum range of the electric vehicle and the time to replace the battery.

The SOH is usually determined by performing a full discharge-charge cycle of the battery, which can be detrimental to the battery.

Also, the conditions in which the full test should be done are quite strict to yield reliable and reproducible results. However, these conditions may be difficult to achieve for the car's owner.

However, various problems exist related to the performing of measurements to determine the battery's SOH under real world conditions.

SUMMARY

Accordingly, it is an object of the present disclosure to resolve the above mentioned problems in providing an easier and less-invasive method for evaluating a state of health (SOH) of an electric battery of an electric vehicle, said method comprising a step of performing a given number of tests on the electric battery, each giving results, associating each result to a state of the battery, a given number of states of the battery being possible, estimating a probability of each state of the battery on the basis of a Bayesian calculation, and estimating the SOH in function of the probability of each state and of the results of the tests, called estimated SOH.

The claimed method provides a good estimation of the SOH of the battery between two complete SOH tests, thanks to a bayesian exploitation of data.

According to an embodiment, the results of the tests are from a dataset comprising tests that include partial charge and/or discharge action of the battery, called proxy tests and/or tests that include a full charge and/or discharge action of the battery, called full test.

According to an embodiment, a confidence value is assigned to the estimated SOH on the basis of previous estimated SOH values and a last full test value.

According to an embodiment, the confidence value (CV) of a proxy test is given by the following equation:

$$CV = \frac{\sum_{i=1}^{K} C_i}{K},$$

where $$C_i = \frac{1}{2^{|SOH - estimated\ SOH(i)|}},$$

SOH being the last full test value and estimated SOH(i) being previous estimated SOH value number i.

According to an embodiment, the method comprises a step of performing a full test if the confidence value is below a given threshold.

According to an embodiment, the performed tests are proxy tests.

The disclosure also relates to a computer program comprising a sequence of instructions implementing the steps of the method as already described.

The disclosure also relates to a non-transitory storage medium readable by computer comprising a computer program as already described.

The disclosure also relates to a system, comprising a sensor for performing said tests and a unit comprising said non-transitory medium.

BRIEF DESCRIPTION OF THE DRAWINGS

Various example features will be apparent from the detailed description which follows, taken in conjunction with the accompanying drawings, wherein:

FIG. 1 is a block diagram of an example method for evaluating a state of health of an electric battery of an electric vehicle according to the present disclosure.

DETAILED DESCRIPTION

Method for Evaluating a State of Health of an Electric Battery

The disclosure relates to a method for evaluating a state of health (SOH) of an electric battery of an electric vehicle, said method being referenced to as 1.

As already explained, the SOH is an indicator for the capacity of the battery or alternatively its degradation, which is a percentage indicating to what extent a battery's current capabilities match to its initial factory specifications.

In other word, a SOH correspond to the remaining portion of the electric battery potential.

The method 1 comprises a step 2 of performing a given number, noted m, of tests on the electric battery.
Battery SOH The method 1 comprises a further step 3 of associating each result R to a state of the battery, a given number N of states of the battery being possible.

For instance, there are three possible states (SOH) for the battery, each state corresponding to the following color:

Green if the remaining potential is above 70%,

Orange if the remaining potential is between 40% and 70%, and

Red if the remaining potential is below 40%.

Indeed, the disclosure is not limited to this example, and the method can comprise more or on the contrary less battery states.

Proxy Tests and Full Tests

Preferably, the tests that are performed are called proxy tests. The proxy tests include partial charge and/or discharge action of the battery, whereas other tests, called full tests, include a full charge and/or discharge action of the battery.

The proxy tests are less invasive than the full tests.

Also, the conditions in which the full tests should be done are quite strict to yield reliable and reproducible results whereas the proxy tests are easier to achieve, the owner of the car deciding the conditions of the proxy tests.

The proxy tests may comprise different kinds of tests.

For example, a proxy test consists in a simple measurement of a conductance of the battery (M1 in the table below), rate of voltage discharge of the battery (test M2 in the table below), and heat measurement of the battery (test M3 in the table below).

In other words, each proxy test comprises M types of tests, each giving Boolean results.

Advantageously, the Boolean results of the proxy tests are stored in a dataset.

The dataset may also comprise results of previous full tests that were done on the battery.

Preferably, the dataset also comprises results of proxy tests and full tests of other vehicles, for instance vehicles of the same car model.

The method 1 further comprises a step 4 of estimating a probability of each state of the battery on the basis of a Bayesian calculation, as will be described below.

The method 1 comprises a final step of estimating the SOH in function of each state, called estimated SOH, as will be detailed below.

The estimated SOH is very powerful in the sense that it gives an indication of the remaining potential of the electric battery without having to perform a full test, which, as already explained, is invasive and complex.

Estimating a Probability of Each State

The following table gives an example of the Boolean results of a proxy test.

Each test M1, M2, M3 can either succeed or fail, such that each test is associated to two Boolean results, noted respectively T1 (test passed), $\overline{T1}$ (test failed), T2 (test passed), $\overline{T2}$ (test failed), and T3 (test passed) and $\overline{T3}$ (test failed):

| Battery state (SOH) | M1 T1 | M1 $\overline{T1}$ | M2 T2 | M2 $\overline{T2}$ | M3 T3 | M3 $\overline{T3}$ | Total |
|---|---|---|---|---|---|---|---|
| Green | 40 | 10 | 35 | 15 | 40 | 10 | 50 |
| Orange | 20 | 10 | 15 | 15 | 25 | 5 | 30 |
| Red | 15 | 5 | 15 | 5 | 10 | 10 | 20 |
| Total | 75 | 25 | 65 | 35 | 75 | 25 | 100 |

The last full test had for results 50 green SOH, 30 orange ones and 20 red ones.

A proxy test is performed, which results in T1, T2 and $\overline{T3}$.

The method 1 estimates the SOH, Le, the estimated SOH, with the following equations based on the Bayes theorem:

$$P(\text{green}/T1, T2, \overline{T3}) = \frac{P(T1/\text{green})P(T2/\text{green})P(\overline{T3}/\text{green})}{Pn}P(\text{green}),$$

$$P(\text{orange}/T1, T2, \overline{T3}) = \frac{P(T1/\text{orange})P(T2/\text{orange})P(\overline{T3}/\text{orange})}{Pn}P(\text{orange}),$$

$$P(\text{red}/T1, T2, \overline{T3}) = \frac{P(T1/\text{red})P(T2/\text{red})P(\overline{T3}/\text{red})}{Pn}P(\text{red}),$$

Where Pn is a normalization coefficient:

$$Pn = P(\text{green})P(\text{orange})P(\text{red}).$$

Please note that $P(\text{green}/T1, T2, \overline{T3})$ is the probability that the SOH is green knowing the proxy test T1, T2 and $\overline{T3}$, $P(\text{orange}/T1, T2, \overline{T3})$ is the probability that the SOH is orange knowing the proxy test T1, T2 and $\overline{T3}$, and $P(\text{red}/T1, T2, \overline{T3})$ is the probability that the SOH is red knowing the proxy test T1, T2 and $\overline{T3}$.

Please also note that $P(Ti/\text{green})$ is the probability of Ti knowing that the SOH is green, while $P(Ti/\text{orange})$ is the probability of Ti knowing that the SOH is orange and $P(Ti/\text{red})$ is the probability of Ti knowing that the SOH is red.

Furthermore, please note that $P(\text{green})$ is the probability that the SOH is green, $P(\text{orange})$ is the probability that the SOH is orange, and $P(\text{red})$ is the probability that the SOH is red.

It can be deduced from the table that $P(\text{green})=0.5$, $P(\text{orange})=0.3$, and $P(\text{red})=0.2$.

And $Pn=0.03$.

Additionally, $P(T1/\text{green})=0.4$, $P(T2/\text{green})=0.35$ and $P(\overline{T3}/\text{green})=0.1$.

Moreover, $P(T1/\text{orange})=0.2$, $P(T2/\text{orange})=0.15$ and $P(\overline{T3}/\text{orange})=0.05$.

Also, $P(T1/\text{red})=0.15$, $P(T2/\text{red})=0.15$ and $P(T3/\text{red})=0.1$.

Therefore, $$P(\text{green}/T1,T2,\overline{T3})=0.23,$$

$$P(\text{orange}/T1,T2,\overline{T3})=0.015,$$

$$P(\text{red}/T1,T2,\overline{T3})=0.015.$$

Since green SOH has the strongest probability, the estimated SOH is green, i.e., the remaining potential is estimated to be above 70%.

Confidence Value

Advantageously, a confidence value is assigned to a sequence of K estimated SOHs, preferably on the basis of previous estimated SOH values and the last full test value.

All these values are stored in the dataset.

The confidence value of the sequence can be used for instance to decide whether another full test should be performed.

If the distance between the last SOH and the estimated SOH is too big |last SOH−estimated SOH(i)| it might be decided that a given sequence of the estimated SOHs, or at least the most recently estimated SOH of the sequence, should not be stored in the dataset.

The confidence value, noted CV, is calculated by giving an attenuation coefficient to the estimated SOH that differs from the SOH in proportion with the difference between the SOH and the "estimated SOH" positions on a given scale.

The scale goes from 1 to N (number of SOH with the decreasing order of potential value), the numbers in the scales being associated increasingly with the remaining potential of the battery For each estimated SOH (i), for a given last SOH, the coefficient can be chosen for instance to be:

$$C_i = \frac{1}{2^{|last\ SOH - estimated\ SOH(i)|}}.$$

And the confidence value is calculated with the following equation:

$$CV = \frac{\sum_{i=1}^{K} C_i}{K}.$$

These calculations are now detailed with two examples.

Please note that the disclosure is not limited to this kind of calculation.

Another method, for instance, an exponential smoothing procedure, can be used to obtain an estimated SOH that is smoothed-out over time by averaging the estimated SOHs:

estimated SOH(k)=I.estimated SOH(k)+(1−I).estimated SOH(k−1),

Where I≤1.

Thanks to this equation, the estimated SOH is updated each time it is calculated, with an historic oversight factor. When I is close to I, the forecast is flexible and fast and gives more weight to the latest measures.

First Example

The following scale is applied: SOH green=3; Orange=2; Red=1.

The sequence comprises 10 (K=10) successive estimated SOHs.

The last full test was 3 (green):

| i | 1 | 2 | 3 | 4 | 5 | 6 | 7 | 8 | 9 | 10 |
|---|---|---|---|---|---|---|---|---|---|---|
| Estimated SOH (i) | 3(G) | 3(G) | 2(O) | 1(R) | 3(G) | 2(O) | 3(G) | 3(G) | 2(O) | 3(G) |
| $C_i$ | 1 | 1 | ½ | ¼ | 1 | ½ | 1 | 1 | ½ | 1 |

And then the confidence value of the sequence is CV=7.75/10=77%.

Second Example

The following scale is applied: SOH green=3; Orange=2; Red=1.

The sequence comprises 10 (K=10) successive estimated SOHs.

The last full test was 2 (orange):

| i | 1 | 2 | 3 | 4 | 5 | 6 | 7 | 8 | 9 | 10 |
|---|---|---|---|---|---|---|---|---|---|---|
| Estimated SOH (i) | 3(G) | 3(G) | 2(O) | 1(R) | 3(G) | 2(O) | 2(G) | 3(G) | 2(O) | 2(G) |
| $C_i$ | ½ | ½ | 1 | ½ | ½ | 1 | 1 | ½ | 1 | 1 |

And then the confidence value of the sequence is CV=7.5/10=75%.

System

The disclosure also relates to a computer program comprising a sequence of instructions implementing the steps of the method as already described when executed by a processor.

The disclosure also relates to a non-transitory storage medium readable by computer comprising said computer program.

Additionally, the disclosure relates to a system comprising at least one sensor to perform the proxy tests and a unit comprising said non-transitory medium.

The invention claimed is:

1. A method for evaluating a state of health (SOH) of an electric battery of an electric vehicle, said method comprising:

performing a given number (m) of tests on the electric battery to generate a plurality of results, each of said tests giving a result of the plurality, wherein the plurality of results are from a dataset comprising proxy tests, which include partial charge and/or discharge action of the battery and/or full tests, which include a full charge and/or discharge action of the battery;

associating each result with a state of a given number (N) of possible states of the battery;

estimating a probability of each state of the battery on the basis of a Bayesian calculation; and estimating the SOH in function of the probability of each state and of the plurality of results, wherein a confidence value is assigned to the estimated SOH on the basis of previous estimated SOH values and a last full test value.

2. The method of claim 1, wherein the confidence value (CV) is given by the following equation:

$$CV = \frac{\sum_{i=1}^{K} C_i}{K},$$

where $$C_i = \frac{1}{2^{|SOH - estimated\ SOH(i)|}},$$

SOH being the last full test value and estimated SOH(i) being previous estimated SOH value number i.

3. The method of claim 1, further comprising performing another full test if the confidence value is below a given threshold.

4. The method of claim 1, wherein the (m) performed tests are proxy tests, which include partial charge and/or discharge action of the battery.

5. A non-transitory computer-readable medium having stored thereon computer-executable instructions for carrying out the method of claim 1.

6. A system, comprising a sensor for carrying out the method of claim 1.

* * * * *